US010566752B2

(12) United States Patent
Tamai (10) Patent No.: US 10,566,752 B2
(45) Date of Patent: Feb. 18, 2020

(54) BLADE BODY

(71) Applicant: Hirose Electric Co., Ltd., Tokyo (JP)

(72) Inventor: Nobuhiro Tamai, Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 55 days.

(21) Appl. No.: 15/607,633

(22) Filed: May 29, 2017

(65) Prior Publication Data

US 2017/0346247 A1    Nov. 30, 2017

(30) Foreign Application Priority Data

May 30, 2016  (JP) .................. 2016-107670

(51) Int. Cl.
| | | |
|---|---|---|
| B23P 19/00 | (2006.01) | |
| H01R 33/76 | (2006.01) | |
| H01R 13/6474 | (2011.01) | |
| H01R 13/405 | (2006.01) | |
| H01R 13/6471 | (2011.01) | |
| H01R 43/05 | (2006.01) | |
| H01R 43/20 | (2006.01) | |
| H05K 13/04 | (2006.01) | |

(Continued)

(52) U.S. Cl.
CPC ....... *H01R 33/7628* (2013.01); *H01R 13/405* (2013.01); *H01R 13/6471* (2013.01); *H01R 13/6474* (2013.01); *H01R 43/05* (2013.01); *H01R 43/205* (2013.01); *H05K 13/0465* (2013.01); *H01R 12/7082* (2013.01); *H01R 12/712* (2013.01); *H01R 13/6588* (2013.01); *H01R 33/7614* (2013.01); *H01R 43/048* (2013.01); *H01R 43/20* (2013.01); *H05K 13/046* (2013.01); *Y10T 29/53174* (2015.01)

(58) Field of Classification Search
CPC .............. H01R 12/7082; H01R 12/707; H01R 13/6582; H01R 13/6586; H01R 13/518; H01R 13/6471; H01R 24/28; H01R 24/60; H01R 25/165; Y10T 29/49155; Y10T 29/49002; Y10T 29/49876; Y10T 29/53174; Y10T 29/5327
USPC ....... 29/739, 592.1, 747, 757, 874, 876, 884
See application file for complete search history.

(56) References Cited

U.S. PATENT DOCUMENTS

| | | | | |
|---|---|---|---|---|
| 8,460,007 B1 * | 6/2013 | Xie | ..................... | H01R 13/6205 439/289 |
| 2013/0089991 A1 * | 4/2013 | Ito | ........................ | H01R 12/721 439/65 |
| 2015/0079819 A1 * | 3/2015 | Tamai | ................ | H01R 12/7082 439/101 |

FOREIGN PATENT DOCUMENTS

JP          5820858 B2    11/2015

* cited by examiner

*Primary Examiner* — Thiem D Phan
(74) *Attorney, Agent, or Firm* — Procopio, Cory, Hargreaves & Savitch LLP (57) ABSTRACT

A plurality of signal terminals are disposed in parallel and comprise an embedded part embedded and held in a base member of insulating material and a protruding part that protrudes from the base member, the protruding part forms a connecting part that is electrically connected by contacting or solder-connecting to a mating connecting body, the base member comprises a main body holding part that covers the entire circumference of the circumferential surface of the signal terminals and holds the signal terminals, and a semi-exposed holding part that exposes a portion of the circumferential surface of the signal terminals while covering and holding the remaining portion, with the protruding part of (Continued)

the signal terminals protruding from the semi-exposed holding part with regard to the main body holding part.

6 Claims, 6 Drawing Sheets

(51) Int. Cl.
*H01R 12/70* (2011.01)
*H01R 13/6588* (2011.01)
*H01R 12/71* (2011.01)
*H01R 43/048* (2006.01)

BLADE BODY

CROSS REFERENCE TO RELATED APPLICATIONS

This Paris Convention Patent Application claims benefit under 35 U.S.C. § 119 and claims priority to Japanese Patent Application No. JP 2016-107670, filed on May 30, 2016, titled "BLADE BODY", the content of which is incorporated herein in its entirety by reference for all purposes.

TECHNICAL FIELD

The present invention relates to a blade body in which terminals held by a base member comprise connecting parts on both sides, and which electrically connects to a mating connecting body by the connecting parts.

BACKGROUND ART

This type of blade body is disclosed in Patent Document 1 related to a relay electrical connector holding a plurality of the blade bodies.

In the blade body disclosed in the Patent Document 1, a plurality of signal terminals and ground terminals forming a metal strip shape are disposed in parallel to each other and comprise an embedded part that is embedded and held in a base member of an insulating material, except at one end side and the other end side, and a protruding part that protrudes from the base member on said one end side and the other end side, and with the protruding part forming a contacting part that is electrically connected by contact with a mating connecting body.

The protruding part has a greater terminal width than the embedded part, in other words, the embedded part has a narrower terminal width than the protruding part in order to match impedance with the embedded part. Furthermore, in order to avoid a sudden change in terminal width, the terminal width of the embedded part is made to gradually change at the boundary region with the protruding part as a tapered part.

PRIOR ART DOCUMENTS

Patent Document

Patent Document 1: Japanese Patent No. 5820858

SUMMARY OF THE INVENTION

Problems to be Solved by the Invention

However, in the blade body in Patent Document 1, the terminal width gradually changes in the boundary region with the protruding part tapering toward the embedded part of the signal terminals, but the base member holding the signal terminals is suddenly absent from the portion holding the embedded part, and therefore, matching of the impedance between the embedded part and the protruding part was determined to be insufficient due to the sudden change in the embedding insulating material. In addition to the problem of electrical characteristics, there is also a problem of insufficient holding strength of the signal terminals in the vicinity of the protruding part. In order to resolve the holding strength problem and ensure adequate holding strength, widening the terminal width at the embedded part is required, which causes a problem of not being able to match the impedance.

In view of the foregoing, an object of the present invention is to provide a blade body that improves impedance matching between the embedded part and the protruding part of the signal terminals, and that can improve the strength at the base section of the protruding part.

Means for Solving the Problems

In a blade body relating to the present invention, a plurality of signal terminals forming a metal strip shape are disposed in parallel to each other and comprise an embedded part that is embedded and held in a base member of an insulating material and a protruding part that protrudes from the base member on one end side, with the protruding part forming a connecting part that is electrically connected by contacting or solder-connecting to a mating connecting body.

In such a blade body, according to the present invention, the base member comprises a main body holding part that covers the entire circumference of the circumferential surface of the signal terminals and holds the signal terminals, and a semi-exposed holding part that exposes a portion of the circumferential surface of the signal terminals while covering and holding the remaining portion, with the protruding part of the signal terminals protruding from the semi-exposed holding part at one end side position with regard to the main body holding part; and at least a portion of the semi-exposed holding part is formed to be thinner than the main body holding part, and at least a portion of the embedded part corresponding to the main body holding part is formed to have a narrower terminal width than the protruding part.

With the present invention configured as described above, the signal terminals in the region that is adjacent to the protruding part are held by a semi-exposed holding part wherein a portion of the circumferential surface is exposed and the other portions are covered by the insulating material, and therefore, the holding strength of the signal terminals is ensured, and the semi-exposed holding part is formed as a holding portion of intermediate insulating material between the embedded part which is completely embedded by the insulating material and the protruding part which is not held by the insulating material, and therefore, sudden changes in the presence of insulating material with respect to the terminals are avoided in favor of gradual changes, and impedance matching is improved.

In the present invention, in the semi-exposed holding part, a signal terminal can have one surface of the four surfaces that form the circumferential surface of the signal terminal exposed, while the remaining three surfaces are covered by an insulating material. Thus, when creating the semi-exposed holding part, only one surface can be formed to be exposed, and therefore, molding is simple. Furthermore, even if the portion where the semi-exposed holding part is thinner than the base member receives contact pressure during contact with a mating connecting body, the holding strength is maintained while elastic deflection will be easier to achieve than with the base member as described above.

In the present invention, in the semi-exposed holding part, the signal terminals preferably have a terminal width that narrows toward the main body holding part. Therefore, when the terminal width gradually narrows in the region of the semi-exposed holding part, the terminal width changes gradually rather than suddenly, and therefore, impedance matching is improved.

In the present invention, the base member preferably has an embedded ground terminals parallel to the signal terminals, and holds a shield plate that covers the surface of the base member in the area where the signal terminals are present, the semi-exposed holding part has a window formed so as to partially expose a surface opposite to the exposed surface of the ground terminals, a shield plate is positioned on the opposite surface side, a portion of the shield plate has an elastic piece, and the elastic piece contacts the ground terminals within the window. Therefore, by having ground terminals and a shield plate, high-speed signal transmission can be accommodated, and in this case, an elastic piece forms conductive contact with the ground terminals and grounding can be achieved by a simple structure. Furthermore, the ground terminals can be held by the semi-exposed holding part in a similar manner as the signal terminals. Furthermore, if the shield plate comes into contact with the semi-exposed holding part, the semi-exposed holding part is reinforced.

In the present invention, a portion of the shield plate is preferably embedded and held in the base member, and thus the shield plate is adequately held.

Effects of the Invention

As described above, in the present invention, adjacent to the protruding part where a signal terminal protrudes from the base member, a semi-exposed holding part is formed in the base member, and the terminal width in the semi-exposed holding part is made greater than the terminal width in the main body holding part of the base member, while the semi-exposed holding part is provided such that the degree of the circumferential surface covered by the insulating material is intermediate between a state in which the entire circumference of the main body holding part is covered and a state in which the protruding part protruding from the base member is completely exposed, thus avoiding any sudden change in the covering insulating material, and impedance matching between the embedded part and the protruding part is improved. Furthermore, the portion where the semi-exposed holding part is thinner than the main body holding part can have sufficient flexibility and elastic deformation when connected with the mating connecting body, even if the signal terminal is held by the semi-exposed holding part.

BRIEF DESCRIPTION OF THE DRAWINGS

FIGS. 4(A) and 4(B) illustrate a vertical cross-sectional view of the relay connecting body of FIG. 1, where

FIGS. 5(A) and 5(B) are perspective views illustrating the terminal connecting part, the semi-exposed holding part of the base member, and the periphery thereof, where FIG. 5(A) is a diagram as viewed from one surface, and FIG. 5(B) is a diagram as viewed from another surface.

FIGS. 6(A) to 6(E) illustrate the connecting part, the semi-exposed holding part, and the periphery thereof from FIGS. 5(A) and 5(B), where FIG. 6(A) is a plan view.

MODES FOR CARRYING OUT THE INVENTION

An embodiment of the present invention will be described below with reference to the accompanying drawings.

The blade body of the present embodiment is embedded into the relay connecting body where connecting members such as circuit boards or the like are mutually electrically connected. A plurality of the relay connecting bodies may be arranged side-by-side to form one relay connector.

Figure 1:
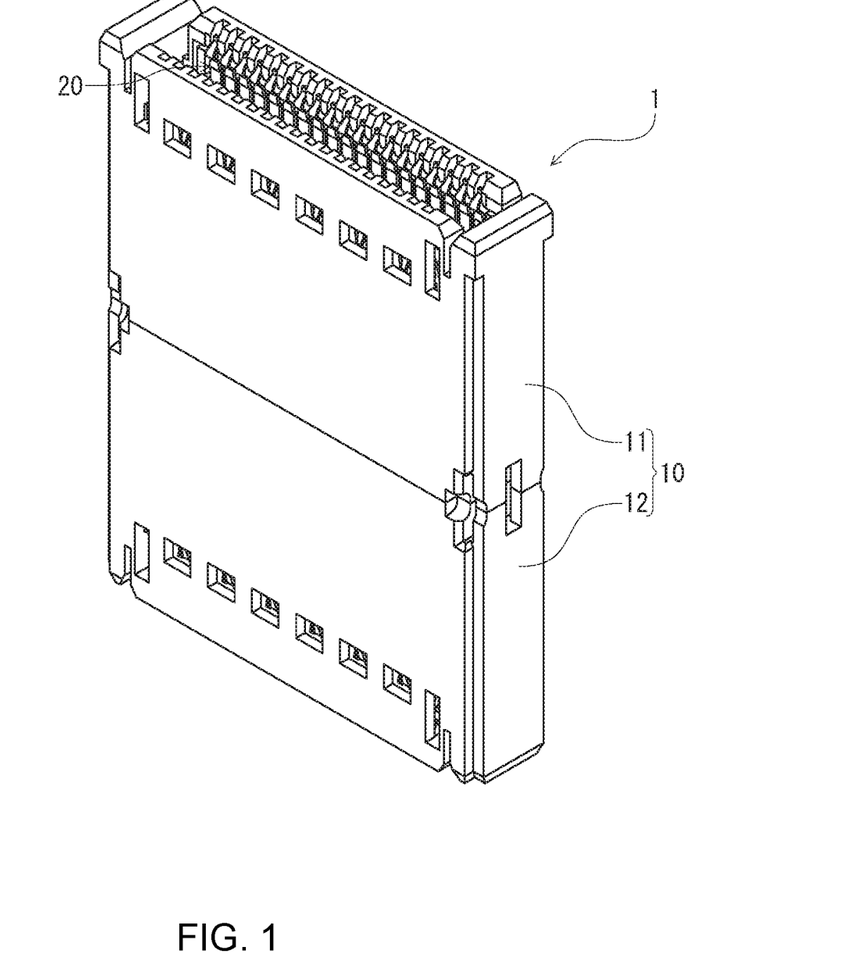
FIG. 1 is a perspective view illustrating the entire relay connecting body containing the blade body as an embodiment of the present invention.

In the present embodiment, a relay connecting body 1 is formed containing two parallel blade bodies 20 in a rectangular parallelepiped housing 10 with a small thickness with respect to width, as seen in FIG. 1. The housing 10 is divided into an upper housing 11 and a lower housing 12. In the upper housing 11 and lower housing 12, the upper half of the blade body 20 is first contained inside one of the housings, and then the housings are combined to contain the lower half of the blade body 20, forming one housing 10. The housing 10 has a containing space for a blade that passes through vertically, and connecting parts of the terminals of the blade body 20 which are described later are positioned at the opening of the upper and lower ends.

Figure 2:
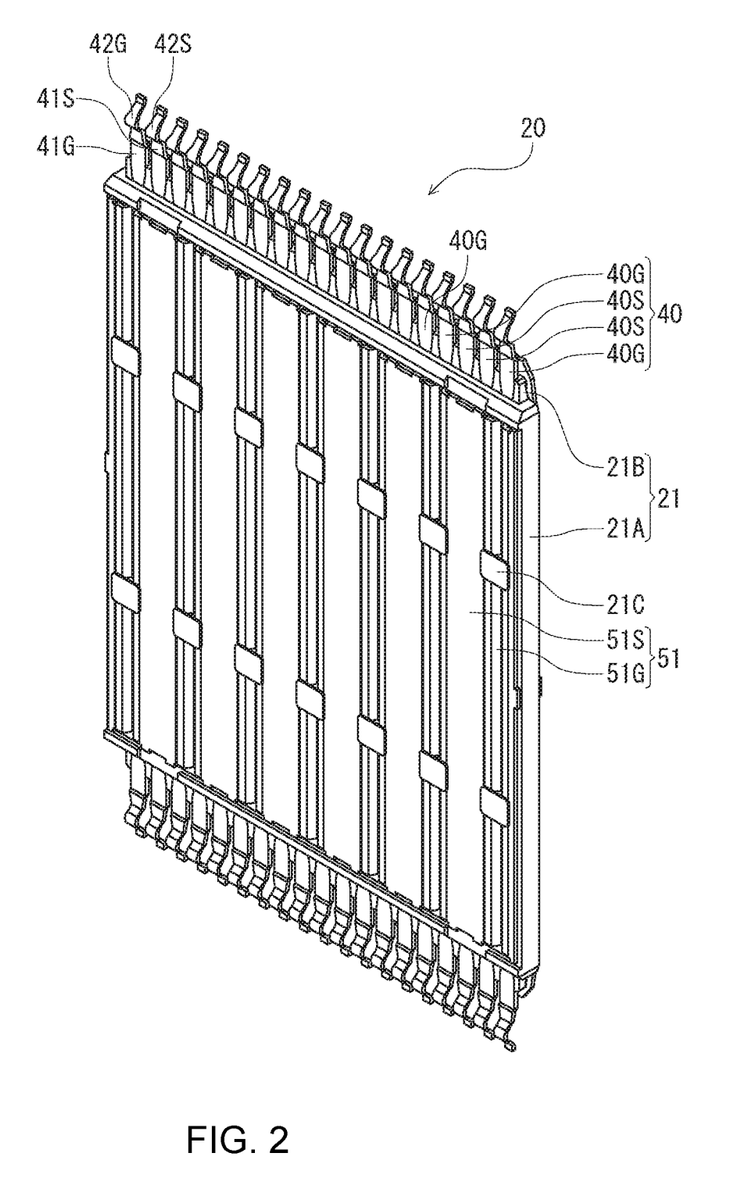
FIG. 2 is a perspective view of the blade body used in the relay connecting body of FIG. 1, as viewed from one surface.
Figure 3:
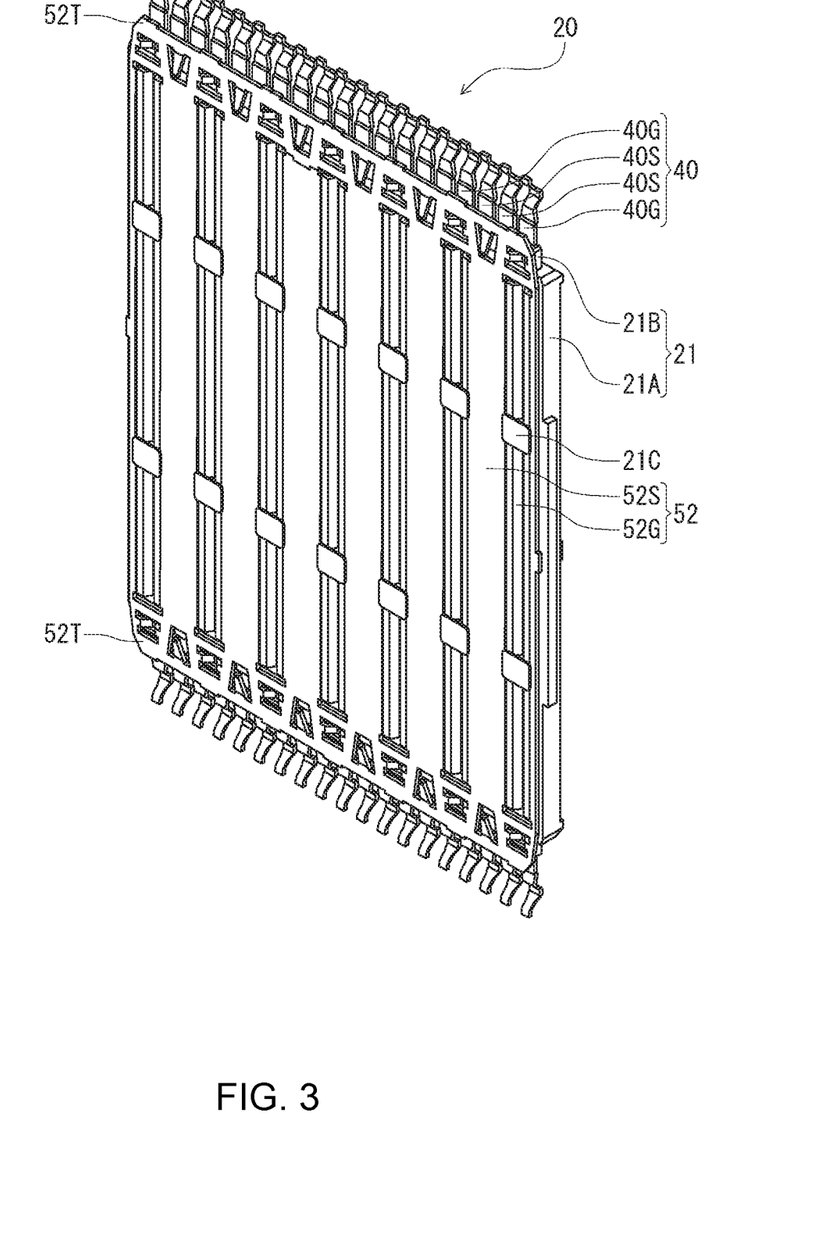
FIG. 3 is a perspective view of the blade body used in the relay connecting body of FIG. 1, as viewed from another surface.

The entire blade body 20 is as shown in FIG. 2 and FIG. 3. FIG. 2 is a diagram of the blade body 20 viewed from one surface, and FIG. 3 is a diagram viewed from the other surface. The blade body 20 holds a plurality of elongated strips of terminals 40 by a base member 21 comprised by a tabular insulating material, and shield plates 50 comprised by a first shield plate 51 and a second shield plate 52. A plurality of terminals 40 are comprised by signal terminals 40S and ground terminals 40G, and the connecting parts of the signal terminals 40S and the ground terminals 40G have the same shape. In the present embodiment, the terminals are arranged in an order of 40G, 40S, 40S, 40G, 40S, 40S, 40G, etc. The two signal terminals 40S positioned in between the ground terminals 40G form a pair of terminals suitable for high-speed signal transmission, and are shielded by being sandwiched between ground terminals 40G. On the terminals 40, the connecting parts for connecting with the mating connecting body are formed on the protruding parts 41S of the terminals protruding from the upper and lower ends of the base member 21, and the embedded parts embedded in the base member 21 are formed in the region bounded by the protruding parts of both the upper and lower ends.

With regard to a signal terminal 40S, the base member 21 has a main body holding part 21A that embeds and holds the embedded part covering the entire circumference of the terminal periphery, across a long range in the longitudinal direction of the terminal, and a semi-exposed holding part 21B that is positioned adjacent to the end part of the main body holding part 21A where a portion of the terminal periphery is exposed and the remaining portion is covered. In other words, the protruding part 41S of a signal terminal 40S protrudes from the semi-exposed holding part 21B, and the connecting part 42S that is electrically connected by contacting or solder-connecting to a mating connecting body is formed at the tip end part of the protruding part 41S. The protruding parts 41S of the signal terminals 40S and the semi-exposed holding part 21B of the base member 21 are described below.

The base member 21 holds the signal terminals 40S with the main body holding part 21A, but with regard to the ground terminals 40G, small short column parts protruding from the surface of the base member 21 in several areas in a range corresponding to the main body holding part 21A in the terminal longitudinal direction penetrate pore parts of the ground terminals 40G to provide support. In other words, the ground terminals 40G are not embedded and held by the base member 21, and are supported by the short column parts. The ground terminals 40G are similar to the signal terminals 40S, other than in the main body holding part 21A, and comprise a connecting part 42G at the tip end part of the protruding part 41G that protrudes from the semi-exposed holding part 21B.

Thus, for the signal terminals 40S and the ground terminals 40G held by the base member 21, the connecting part 42S of the signal terminals 40S and the connecting part 42G of the ground terminals 40G are made to be the same shape and same size, but there is a difference in the shape and size in the embedded part of the signal terminals 40S held by the main body holding part 21A of the base member 21. Namely, the embedded part of the signal terminals 40S has a narrower width than the connecting part 42S and the embedded part of the ground terminals 40G has a greater width than the connecting part 42G. The connecting part 42S of the signal terminals 40S and the connecting part 42G of the ground terminals 40G have the same shape and same size, and therefore, the embedded part of the signal terminals 40S has a narrower width than the connecting part 42G of the ground terminals 40G.

A shield plate 50 is attached to both surface sides of the base member 21 so as to be suitable for high-speed signal transmission. A first shield plate 51 is attached to one surface of the base member 21 as seen in FIG. 2, and a second shield plate 52 is attached to the other surface as seen in FIG. 3.

The first shield plate 51 has a wave form as shown in FIG. 2, and is formed as one continuous member by alternating a flat plate part 51S, which is separated from the surface of the base member 21 and forms a gap with the surface of the base member 21 in a range corresponding to two signal terminals 40S adjacent in the terminal arranging direction, and a groove plate part 51G, which is immersed relative to the surface of the flat plate part 51S in a range corresponding to the ground terminals 40G between the flat plate parts 51S. The groove plate part 51G is immersed relative to the flat plate part 51S and therefore contacts the ground terminals 40G, and the short column parts penetrating the pore parts formed in the ground terminals 40G penetrate even the corresponding pore parts of the groove plate part 51G, and the protruding head part of the short column parts are heated and crushed into a rivet form to form a locking protruding parts 21C, which hold the first shield plate 51 against the base member 21.

The second shield plate 52, as seen in FIG. 3, has a flat plate part 52S and a groove plate part 52G that are the same form as the flat plate part 51S and the groove plate part 51G of the first shield plate 51. Therefore, the second shield plate 52 is exactly the same as the first shield plate 51 in that there are a flat plate part 52S and a groove plate part 52G. However, in addition to the flat plate part 52S and the groove plate part 52G, the second shield plate 52 has vertically symmetrical end plate parts 52T that are the same shape on the upper and lower ends, and the flat plate part 52S, groove plate part 52G, and end plate parts 52T form one member.

Figure 5A:
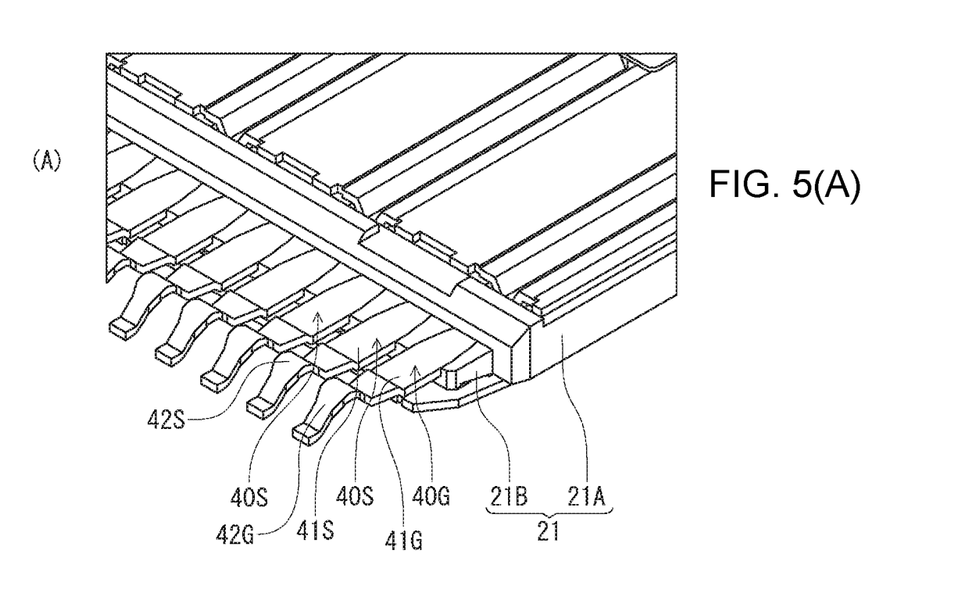
Figure 5B:
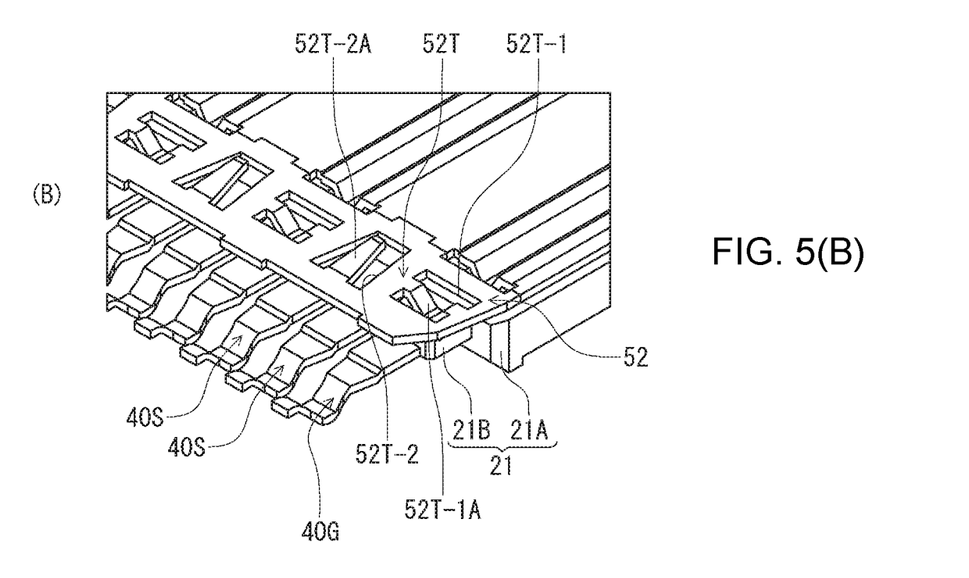

The second shield plate 52 has end plate parts 52T as seen in FIG. 5(B). The end plate parts 52T are formed extending in the terminal arranging direction, and are positioned at both ends in the terminal longitudinal direction of the second shield plate 52. The end plate parts 52T cover without contacting a series of semi-exposed holding parts 21B that hold a plurality of arranged signal terminals 40S and ground terminals 40G.

The end plate parts 52T, in the terminal arranging direction, form windows 52T-1 at the position of the ground terminals 40G and, as seen in FIG. 5(B), are provided with an elastic piece 52T-1A that elastically contacts the exposed portion of the ground terminals 40G by bending towards the protruding part 41G of the ground terminals 40G within the window 52T-1, and in the terminal arranging direction, form windows 52T-2 in the range of two adjacent signal terminals 40S, and are provided with a lance piece 52T-2A cut out and raised from the window 52T-2 in the terminal longitudinal direction. When the blade body 20 is assembled to a housing 10, the lance piece 52T-2A locks to a corresponding portion of the housing 10 and prevents the blade body 20 from detaching.

Figure 4A:
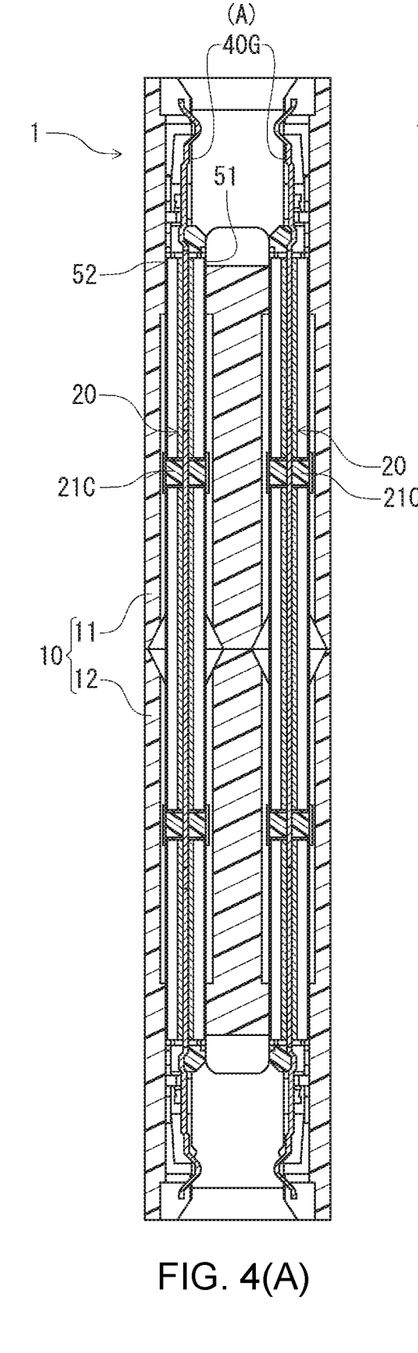
FIG. 4(A) is a cross-sectional view at a ground terminal position.
Figure 4B:
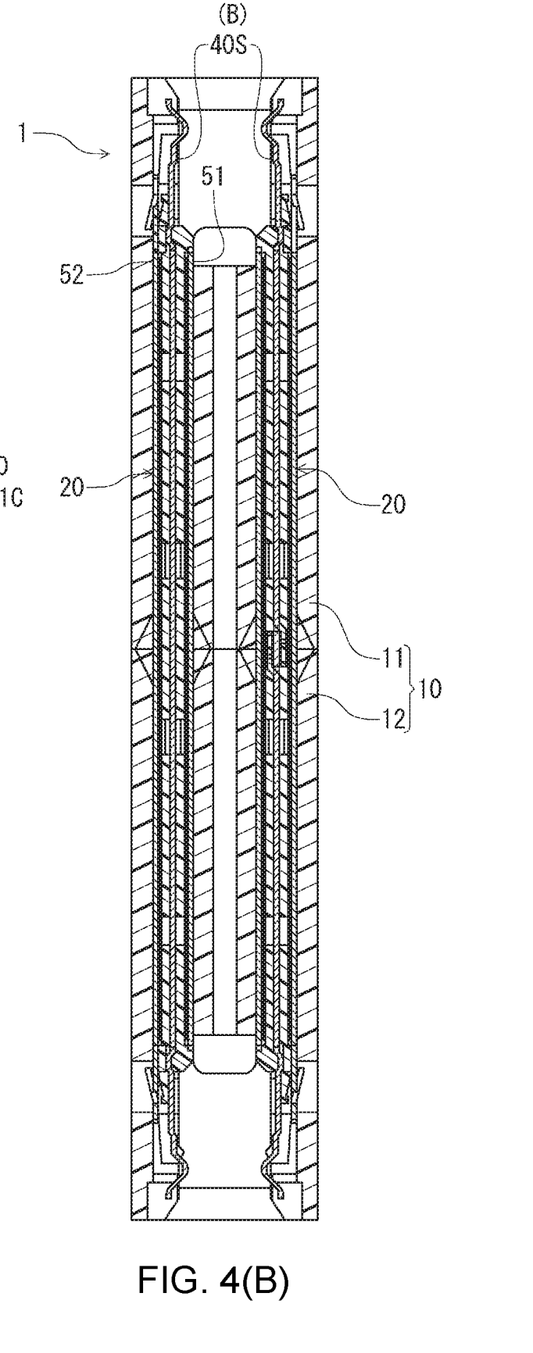
FIG. 4(B) is a cross-sectional view at a signal terminal position.

In this manner, a pair of two blade bodies 20, with a plurality of terminals 40 (signal terminals 40S and ground terminals 40G) held by the base member 21, and with shield plates 50 (first shield plate 51 and second shield plate 52) attached to both surfaces of the base member 21, are disposed in parallel symmetrically facing each other and are held in the housing 10 (refer to FIGS. 4(A), (B)).

Figure 6A:
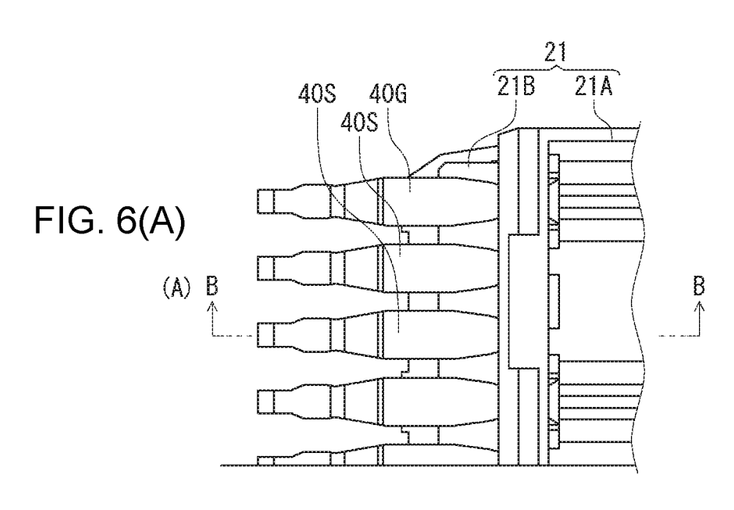
Figure 6B:
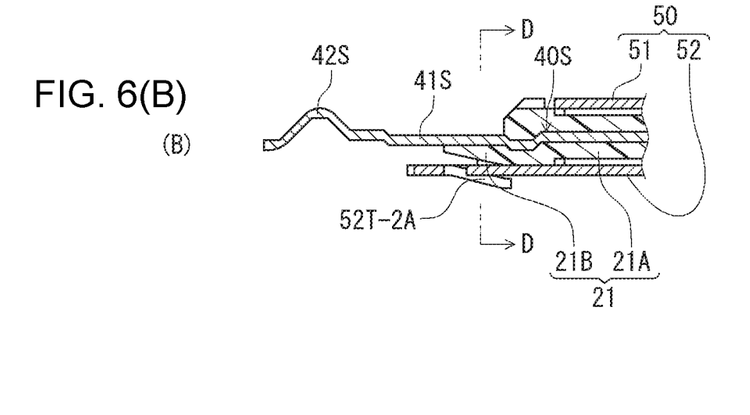
FIG. 6(B) is a cross-sectional view of FIG. 6(A) from line B-B.
Figure 6C:
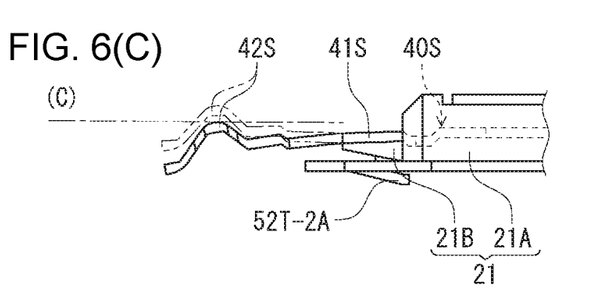
FIG. 6(C) is a side view during elastic displacement of the terminal.
Figure 6D:
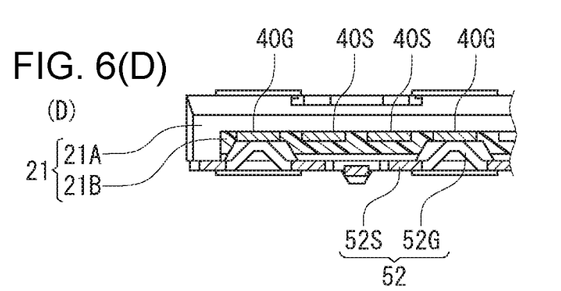
FIG. 6(D) is a cross-sectional view of FIG. 6(B) from line D-D.

Next, the protruding parts 41S of the signal terminals 40S and the semi-exposed holding part 21B of the base member 21 and the periphery thereof are described. FIG. 5 is a view as seen from one surface of the base member, FIG. 5(B) is a view as seen from another surface, FIG. 6(A) is a plan view of FIG. 5(A), FIG. 6(B) is a cross-sectional view along line B-B of FIG. 6(A), FIG. 6(C) is an equivalent view of FIG. 6(B) when a signal terminal is flexed in a state in contact with a mating terminal, and FIG. 6(D) is a cross-sectional view along line D-D in FIG. 6(B). A description of some portions in the drawings which were already described is omitted by assigning the same codes.

In the drawings, the signal terminals 40S are held by the base member 21 (the main body holding part 21A and the semi-exposed holding part 21B). The semi-exposed holding part 21B is thinner than the main body holding part 21A, and one surface thereof is exposed in the circumferential direction with regard to the signal terminals 40S (i.e., only the upper surface in FIG. 5(A)) and the remaining three surfaces are covered (the lower surface and both side surfaces of the signal terminals 40S in FIG. 5(A)). The semi-exposed holding part 21B is tapered to be thin in the direction toward the terminal tip end side on the lower surface side of the signal terminals 40S as seen in FIG. 6(B). In the range of the semi-exposed holding part 21B in the terminal longitudinal direction, the terminal width of the signal terminals 40S gradually narrows from the protruding part 41S toward the portion that is held by the main body holding part 21A (also refer to FIG. 6(A)), and the impedance matches between the embedded part and the protruding part 41S. The terminal width of the protruding part 41S narrows stepwise toward the tip end (free end), a convex portion bent in the plate thickness direction in the vicinity of the tip end is formed, and the convex portion is a connecting part 42S that is in contact with a mating terminal (refer to FIG. 6(B)). As seen in FIG. 6(B), the semi-exposed holding part 21B is thinner than the main body holding part 21A, and is tapered to be thinner toward the terminal tip end side, and therefore, the protruding part 41S of the signal terminals 40S comes into contact with a mating connecting body, and even if flexing occurs up to a position indicated by the dashed-dotted line in FIG. 6(C), the semi-exposed holding part 21B maintains holding strength and follows the flexing of the protruding part 21S. Furthermore, the semi-exposed holding part 21B comes into contact with the second shield plate 52, and therefore, the strength is improved by the second shield plate 52. Furthermore, the strength of the base member 21 can be improved by providing a spring part on the shield plate 50 and contacting the spring part to a surface of the base member 21 by contact pressure.

The form of the protruding part 41S of the signal terminals 40S and the semi-exposed holding part 21B of the base member 21 are adopted in the exact same manner for the ground terminals 40G, and the ground terminals 40G comprise the same connecting part 42G on the protruding part 41G as the connecting part 42S of the signal terminals 40S, which are also held by the semi-exposed holding part 21B.

Figure 6E:
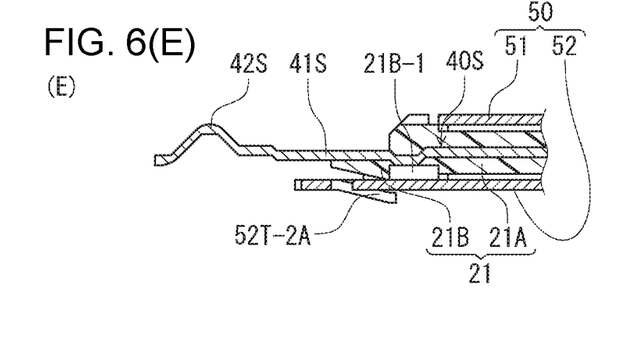
FIG. 6(E) is a cross-sectional view illustrating a modified example of the semi-exposed holding part corresponding to FIG. 6(B).

In the present invention, the semi-exposed holding part 21B covers the terminal bottom surface side, but if broadening at the embedded part more than the terminal width is desired in order to provide strength for the terminal held by the semi-exposed holding part 21B, in conjunction with matching the impedance, a thin (thinned at a right angle to the paper surface as shown in FIG. 6(E)) slit hole 21B-1 can be formed in the terminal bottom surface side of the semi-exposed holding part 21B as shown in FIG. 6(E).

DESCRIPTION OF THE REFERENCE CODES

| | |
|---|---|
| 20 | Blade body |
| 21 | Base member |
| 21A | Main body holding part |
| 21B | Semi-exposed holding part |
| 40 | Terminal |
| 40S | Signal terminal |
| 40G | Ground terminal |
| 41S | Protruding part |
| 42S | Connecting part |
| 50 | Shield plate |
| 51 | First shield plate |
| 52 | Second shield plate |
| 52T-1 | Window |
| 52T-1A | Elastic piece |

What is claimed is:

1. A blade body, comprising:
a plurality of signal terminals forming a metal strip shape that are disposed in parallel to each other, the plurality of signal terminals comprising an embedded part that is embedded and held in a base member made of an insulating material, and a protruding part that protrudes from the base member on one end side and is completely exposed from the insulating material, with the protruding part forming a connecting part that is electrically connected by contacting or solder-connecting to a mating connecting body;
wherein the base member comprises a main body holding part that covers an entire circumference of the circumferential surface of the signal terminals and holds the signal terminals, and a semi-exposed holding part that exposes a portion of the circumferential surface of the signal terminals from the insulating material while covering and holding the remaining portion with the insulating material, with the protruding part of the signal terminals protruding from the semi-exposed holding part at one end side position with regard to the main body holding part; and
at least a portion of the semi-exposed holding part is formed to be thinner than the main body holding part, and at least a portion of the embedded part corresponding to the main body holding part is formed to have a narrower terminal width than the protruding part;
wherein the semi-exposed holding part holds the remaining portion and flexes with the protruding part when the signal terminals are flexed in a state of contact of a mating terminal.

2. The blade body according to claim 1, wherein the signal terminals have one surface of the four surfaces that form the circumferential surface of the signal terminals in the semi-exposed holding part that is exposed, while the remaining three surfaces are covered by an insulating material.

3. The blade body according to claim 1, wherein the signal terminals have a terminal width that narrows toward the main body holding part at the semi-exposed holding part.

4. The blade body according to claim 1, wherein the base member has embedded ground terminals parallel to the signal terminals, and holds a shield plate that covers the surface of the base member in the area where the signal terminals are present, the semi-exposed holding part has a window formed so as to partially expose a surface opposite to the exposed surface of the ground terminals, a shield plate is positioned on the opposite surface side, a portion of the shield plate has an elastic piece, and the elastic piece contacts the ground terminals within the window.

5. The blade body according to claim 1, wherein the base member has embedded ground terminals parallel to the signal terminals, and holds a shield plate that covers the surface of the base member in the area where the signal terminals are present, the ground terminals are held by the semi-exposed holding part together with the signal terminals, the semi-exposed holding part has a window formed so as to partially expose a surface opposite to the exposed surface of the ground terminals, a shield plate is positioned on the opposite surface side, a portion of the shield plate has an elastic piece, and the elastic piece contacts the ground terminals within the window.

6. The blade body according to claim 5, wherein a portion of the shield plate is embedded in the base member.

* * * * *